United States Patent
Kim et al.

(10) Patent No.: US 11,688,841 B2
(45) Date of Patent: Jun. 27, 2023

(54) DISPLAY DEVICE INCLUDING A LIGHT EMITTING DIODE CHIP

(71) Applicant: Seoul Semiconductor Co., Ltd., Ansan-si (KR)

(72) Inventors: Young Hyun Kim, Ansan-si (KR); Motonobu Takeya, Ansan-si (KR); Jong Ik Lee, Ansan-si (KR); Sung Su Son, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 114 days.

(21) Appl. No.: 17/318,542

(22) Filed: May 12, 2021

(65) Prior Publication Data
US 2021/0265547 A1 Aug. 26, 2021

Related U.S. Application Data

(63) Continuation of application No. 16/495,741, filed as application No. PCT/KR2018/002690 on Mar. 7, 2018, now Pat. No. 11,018,285.
(Continued)

(51) Int. Cl.
*H01L 33/62* (2010.01)
*H01L 33/38* (2010.01)
(Continued)

(52) U.S. Cl.
CPC .......... *H01L 33/62* (2013.01); *H01L 33/0093* (2020.05); *H01L 33/38* (2013.01);
(Continued)

(58) Field of Classification Search
None
See application file for complete search history.

(56) References Cited

U.S. PATENT DOCUMENTS 7,704,771 B2  4/2010  Onushkim et al.
8,269,228 B2  9/2012  Lee et al.
(Continued)

FOREIGN PATENT DOCUMENTS

DE  112006002927  6/2010
KR  10-0856230    9/2008
(Continued)

OTHER PUBLICATIONS

International Search Report dated Jun. 14, 2018, issued in International Application No. PCT/KR2018/002690.
(Continued)

*Primary Examiner* — J. E. Schoenholtz
(74) *Attorney, Agent, or Firm* — H.C. Park & Associates, PLC (57) ABSTRACT

A display device including a light emitting diode chip, including: a light emitting structure which includes a first conductive semiconductor layer, a second conductive semiconductor layer, and an active layer interposed between the first and second conductive semiconductor layers; a second electrode which is electrically connected to the second conductive semiconductor layer; an insulation unit which is disposed to cover a part of the top surface of the second electrode and side surfaces of the light emitting structure; and a second fixed part which covers the top surface of the insulation unit and is electrically connected to the second electrode, and at least a part of which extends to the side surfaces of the light emitting structure.

14 Claims, 6 Drawing Sheets

Related U.S. Application Data (60) Provisional application No. 62/475,414, filed on Mar. 23, 2017.

(51) Int. Cl.
    *H01L 33/44*        (2010.01)
    *H01L 33/00*        (2010.01)

(52) U.S. Cl.
    CPC ...... *H01L 33/44* (2013.01); *H01L 2933/0025* (2013.01); *H01L 2933/0066* (2013.01)

(56) References Cited

U.S. PATENT DOCUMENTS

| | | |
|---|---|---|
| 8,592,232 B2 | 11/2013 | Suh et al. |
| 9,111,840 B2 | 8/2015 | Heo et al. |
| 2009/0085048 A1* | 4/2009 | Lee .................. H01L 27/156 257/89 |
| 2009/0272991 A1 | 11/2009 | Lee et al. |
| 2010/0032694 A1 | 2/2010 | Kim et al. |
| 2011/0021530 A1 | 1/2011 | Billich et al. |
| 2014/0231849 A1 | 8/2014 | Song et al. |
| 2014/0361327 A1 | 12/2014 | Chae et al. |
| 2015/0270442 A1 | 9/2015 | Chae et al. |
| 2016/0190396 A1 | 6/2016 | Lee et al. |
| 2016/0308089 A1 | 10/2016 | Kim et al. |
| 2018/0138071 A1 | 5/2018 | Bower et al. |
| 2018/0233645 A1* | 8/2018 | Chae ...................... H01L 33/38 |

FOREIGN PATENT DOCUMENTS

| | | |
|---|---|---|
| KR | 10-2012-0087505 | 8/2012 |
| KR | 10-2014-0103397 | 8/2014 |
| KR | 10-2015-0074321 | 7/2015 |
| KR | 10-2016-0124375 | 10/2016 |
| WO | 2007081092 | 7/2007 |

OTHER PUBLICATIONS

Non-Final Office Action dated Oct. 13, 2020, mailed in U.S. Appl. No. 16/495,741.

Notice of Allowance dated Jan. 22, 2021, mailed in U.S. Appl. No. 16/495,741.

\* cited by examiner

DISPLAY DEVICE INCLUDING A LIGHT EMITTING DIODE CHIP

CROSS-REFERENCE TO RELATED APPLICATIONS

This application is a Continuation of U.S. patent application Ser. No. 16/495,741, filed on Sep. 19, 2019, which is a National Stage Entry of International Application No. PCT/KR2018/002690, filed on Mar. 7, 2018, and claims priority from and the benefit of U.S. Provisional Application No. 62/475,414, filed on Mar. 23, 2017, which are hereby incorporated by reference for all purposes as if fully set forth herein.

BACKGROUND

Field

Exemplary embodiments of the invention relate generally to a display apparatus and a method of manufacturing the same, and, more specifically, to a display apparatus employing a light emitting diode package having a large size as compared with a light emitting diode chip, and a method of manufacturing the same.

Discussion of the Background

A light emitting diode refers to an inorganic semiconductor device that emits light through recombination of electrons and holes. In recent years, light emitting diodes have been used in various fields including displays, automobile lamps, general lighting, and the like. Light emitting diodes have various advantages, such as long lifespan, low power consumption, and rapid response. Thus, light emitting devices using a light emitting diode are rapidly replacing existing light sources.

Recently, display apparatuses, such as TVs, monitors or electronic display boards, realize colors through a thin film transistor liquid crystal display (TFT-LCD) panel, and employ light emitting diodes as a light source of a backlight unit for emission of the realized colors. In addition, various studies have been conducted to develop a display apparatus capable of realizing colors through light emitting diodes instead of using an LCD.

In order to use light emitting diodes as a light source of a backlight unit or for direct realization of colors, one light emitting diode may be provided for each pixel. Here, in order to control each of the light emitting diodes, an active matrix (AM) drive type or a passive matrix (PM) drive type may be employed. For the AM drive type, it is sufficient for the luminous area of each light emitting diode to be 1/10,000 of the area of one pixel, and for the PM drive type, for the luminous area of each light emitting diode to be 1/100 of the area of one pixel.

Light emitting diodes having an excessively large luminous area have suffer from low current density, causing deterioration in luminous efficacy. Therefore, when light emitting diodes having a small luminous area are used, the size of the light emitting diodes becomes too small, and thus, there is a problem that it is not easy to process of mounting a large number of light emitting diodes and process of replacing the light emitting diodes.

The above information disclosed in this Background section is only for understanding of the background of the inventive concepts, and, therefore, it may contain information that does not constitute prior art.

SUMMARY

Exemplary embodiments of the present invention provide a display apparatus including a light emitting diode package, which employs light emitting diodes having a small luminous area as compared with an area of a pixel so as to increase yield in mounting and repair of the light emitting diodes, and a method of manufacturing the same.

Additional features of the inventive concepts will be set forth in the description which follows, and in part will be apparent from the description, or may be learned by practice of the inventive concepts.

An exemplary embodiment of the present invention provides a display apparatus including: a light emitting diode chip, wherein the light emitting diode chip includes: a light emitting structure including a first conductivity type semiconductor layer, a second conductivity type semiconductor layer, and an active layer interposed between the first and second conductivity type semiconductor layers; a second electrode electrically connected to the second conductivity type semiconductor layer; an insulator disposed to cover a portion of an upper surface of the second electrode and side surfaces of the light emitting structure; and a second coupler covering an upper portion of the insulator, and electrically connected to the second electrode, at least a portion of the second coupler extending to the side surfaces of the light emitting structure.

In this case, the first conductivity type semiconductor layer of the light emitting structure may be exposed to the outside and the light emitting diode chip may further include: a first electrode electrically connected to the first conductivity type semiconductor layer; and a first coupler electrically connected to the first electrode, at least a portion of the first coupler extending to the side surfaces of the light emitting structure. The insulator may be disposed to cover a portion of an upper surface of the first electrode.

The light emitting structure may be disposed on a manufacturing substrate, wherein at least a portion of the second coupler may extend to an upper portion of the manufacturing substrate.

The light emitting structure may be disposed on a manufacturing substrate, wherein at least a portion of the first coupler may extend to an upper portion of the manufacturing substrate.

Another exemplary embodiment of the present invention provides a method of manufacturing a display apparatus including: forming a light emitting diode chip on a manufacturing substrate; forming a protector to cover light emitting diode chip; irradiating the light emitting diode chip with a laser to separate the light emitting diode chip from the manufacturing substrate; removing the protector; and transferring the light emitting diode chip from the manufacturing substrate to another substrate. The light emitting diode chip includes: a light emitting structure including a first conductivity type semiconductor layer, a second conductivity type semiconductor layer, and an active layer interposed between the first and second conductivity type semiconductor layers; a second electrode electrically connected to the second conductivity type semiconductor layer; an insulator disposed to cover a portion of an upper surface of the second electrode and side surfaces of the light emitting structure; and a second coupler covering an upper portion of the insulator, and electrically connected to the second electrode, at least a portion of the second coupler extending to the side surfaces of the light emitting structure.

In the transferring step, the second coupler may be separated from the manufacturing substrate when separating the light emitting diode chip from the manufacturing substrate.

The light emitting structure may further include: a first electrode exposing the first conductivity type semiconductor layer to the outside, and electrically connected to the first conductivity type semiconductor layer; and a first coupler electrically connected to the first electrode, at least a portion of the first coupler extending to the side surfaces of the light emitting structure, wherein the insulator may be disposed to cover a portion of an upper surface of the first electrode.

At least a portion of the second coupler may extend to an upper portion of the manufacturing substrate.

At least a portion of the first coupler may extend to an upper portion of the manufacturing substrate.

According to exemplary embodiments of the present invention, even when luminous area of a light emitting diode chip is reduced and an amount of the supplied current is small, there is an effect that the current density flowing through the light emitting diode chip may be increased.

In addition, since the first and second couplers are disposed to cover the light emitting structures of the light emitting diode chip, when separating the light emitting diode chip disposed on the manufacturing substrate, there is an effect that easy detachment of the light emitting diode chip from the manufacturing substrate may be prevented during the process of transferring the light emitting diode chip onto another substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments of the invention. As used herein, "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings.

Figure 1:
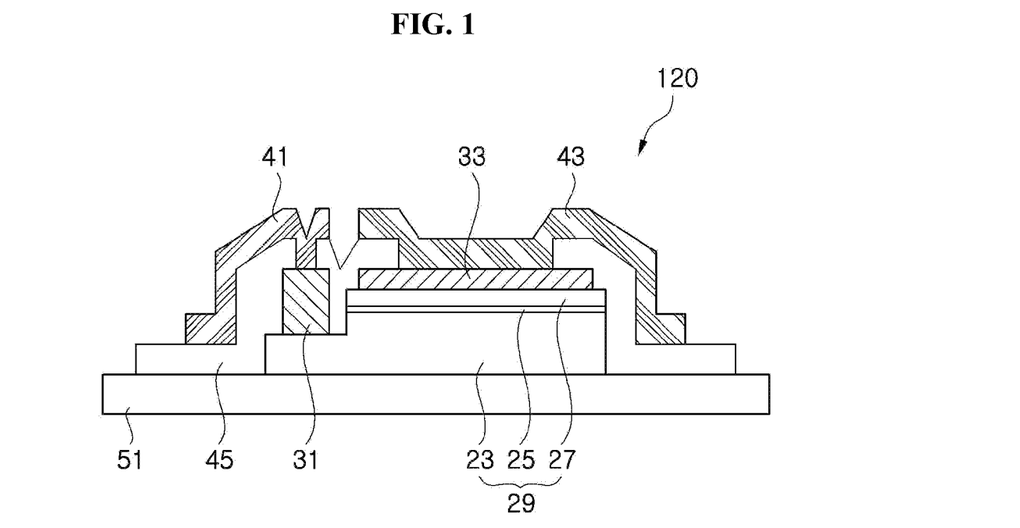
FIG. 1 is a cross-sectional view illustrating a light emitting diode chip of a display apparatus according to a first embodiment of the present invention.

FIG. 1 is a cross-sectional view illustrating a light emitting diode chip of a display apparatus according to a first embodiment of the present invention.

A light emitting diode chip 120 of the display apparatus according to the first embodiment of the present invention includes a light emitting structure 29, an n-type electrode 31, a p-type electrode 33, a first coupler 41, a second coupler 43, and an insulator 45. The light emitting diode chip 120 is disposed on a first manufacturing substrate 51. In the present embodiment, the light emitting diode chip 120 may be grown and manufactured on a separate manufacturing substrate, and then transferred to the first manufacturing substrate 51, or a plurality of light emitting diode chips 120 may be grown and manufactured on the first manufacturing substrate 51. Herein, the first manufacturing substrate 51 may have an insulating material, and have a predetermined thickness. The first manufacturing substrate 51 may be, for example, a sapphire substrate.

In the present embodiment, a single light emitting diode chip 120 is disposed on the first manufacturing substrate 51, but a plurality of light emitting diode chips 120 may be disposed on the first manufacturing substrate 51. The plurality of light emitting diode chips 120 may be regularly disposed along rows and columns on the first manufacturing substrate 51.

An interval between the plurality of light emitting diode chips 120 may be the same as an interval between sub-pixels, or may be smaller than the interval between sub-pixels.

The light emitting structure 29 includes an n-type semiconductor layer 23, an active layer 25, and a p-type semiconductor layer 27. The n-type semiconductor layer 23 may be a conductive semiconductor layer containing n-type dopants (for example, Si), and the p-type semiconductor layer 27 may be a conductive semiconductor layer containing p-type dopants (for example, Mg). The active layer 25 is interposed between the n-type semiconductor layer 23 and the p-type semiconductor layer 27, and may include a multi-quantum well (MQW) structure. The composition of the active layer 25 may be determined to emit light having a desired peak wavelength.

In the present embodiment, a structure of the light emitting structure 29 will be described, where the n-type semiconductor layer 23 is disposed thereunder, and the active layer 25 and the p-type semiconductor layer 27 are disposed over the n-type semiconductor layer 23 in the stated order. In addition, a portion of the n-type semiconductor layer 23 may be exposed upward by partially removing the p-type semiconductor layer 27 and the active layer 25.

In addition, the p-type electrode 33 is disposed over the p-type semiconductor layer 27 to be electrically connected to the p-type semiconductor layer 27. The n-type electrode 31 is disposed over the exposed portion of the n-type semiconductor layer 23 to be electrically connected to the n-type semiconductor layer 23. In this embodiment, the light emitting diode chip 122 may have a horizontal structure in which the n-type electrode 31 and the p-type electrode 33 are arranged in the same direction.

In the present embodiment, the n-type electrode 31 and the p-type electrode 33 may include a metal. The n-type electrode 31 and the p-type electrode 33 are disposed so as to cover the n-type semiconductor layer 23 and the p-type electrode 33, respectively, and may be disposed to cover as wide a range as possible. That is, the n-type electrode 31 and the p-type electrode 33 may serve to reflect light emitted from the light emitting structure 29.

The insulator 45 may be disposed over the light emitting structure 29 so as to cover portions other than some portions of the n-type electrode 31 and the p-type electrode 33. The insulator 45 may be disposed so as to entirely cover the n-type electrode 31, the p-type electrode 33, and the light emitting structure 29, while excluding a portion of an upper surface of the n-type electrode 31 and a portion of an upper surface of the p-type electrode 33. Accordingly, the insulator 45 may insulate the n-type semiconductor layer 23 and the p-type semiconductor layer 27 of the light emitting structure each other, and may also insulate the n-type electrode 31 and the p-type electrode 33 each other. In this embodiment, the insulator 45 may include an insulating material including $SiO_2$ or the like.

In addition, the insulator 45 may extend from side surfaces of the light emitting structure 29 and cover a portion of an upper surface of the first manufacturing substrate 51.

The first coupler 41 may electrically contact the n-type electrode 31, and may be disposed to cover one side surface of the insulator 45. The second coupler 43 may electrically contact the p-type electrode 33, and may be disposed to cover the other side surface of the insulator 45. In this case, the first coupler 41 and the second coupler 43 are spaced apart from each other and electrically insulated from each other. The first coupler 41 and the second coupler 43 may have a conductive material, and may include a metal.

As shown in the drawing, the first coupler 41 and the second coupler 43 are disposed to entirely cover the light emitting structure 29 from the upper portion to the side surfaces excluding a portion where the first coupler 41 and the second coupler 43 are spaced apart from each other. Accordingly, light emitted from side surfaces of the n-type electrode 31 and the p-type electrode 33 may be reflected, not being reflected from the n-type electrode 31 and the p-type electrode 33.

The first coupler 41 and the second coupler 43 are disposed so as to cover the upper surface of the first manufacturing substrate 51 as shown in the drawing. Of course, the insulator 45 is interposed between the first coupler 41 and the second coupler 43 and the first manufacturing substrate 51, but at least some portions of the first coupler 41 and the second coupler 43 are disposed on the first manufacturing substrate 51. Since the first coupler 41 and the second coupler 43 are disposed on the first manufacturing substrate 51, the light emitting diode chip 120 may not be completely separated from the first manufacturing substrate 51 in a process of irradiating the light emitting diode chip 120 with a laser to remove the light emitting diode chip 120 from the first manufacturing substrate 51.

This will be described in more detail with reference to FIGS. 2A through 2E.

FIGS. 2A through 2E are cross-sectional views illustrating a process of transferring the light emitting diode chip of the display apparatus from a manufacturing substrate onto another substrate according to the first embodiment of the present invention.

Referring to FIGS. 2A through 2E, a process of transferring the light emitting diode chip 120 disposed on the first manufacturing substrate 51 to a second manufacturing substrate 53, which is another substrate, will be described. Through this description, functions of the couplers 41 and 43 will be described in detail.

Figure 2A:
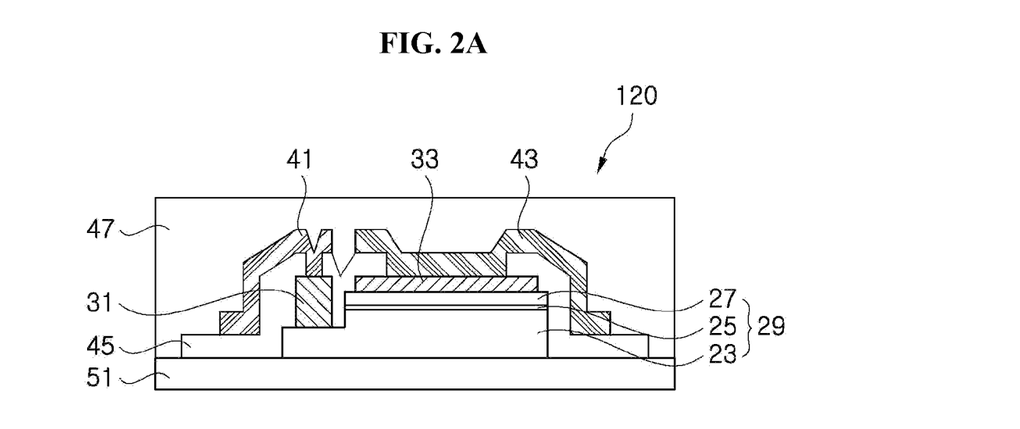
FIGS. 2A, 2B, 2C, 2D, and 2E are cross-sectional views illustrating a process of transferring the light emitting diode chip of the display apparatus from a manufacturing substrate onto another substrate according to the first embodiment of the present invention.

As shown in FIG. 1, after the light emitting diode chip 120 is disposed or manufactured on the first manufacturing substrate 51, a protector 47 is formed to entirely cover the light emitting diode chip 120 as shown in FIG. 2A. The protector 47 may prevent the light emitting diode chip 120 from being damaged by irradiation when the light emitting diode chip 120 is irradiated with a laser in a subsequent process. In this embodiment, the protector 47 may include at least one of poly dimethylpolysiloxane (PDMS), polyimide, PMMA poly (methyl 2-methylpropenoate), and ceramics.

Figure 2B:
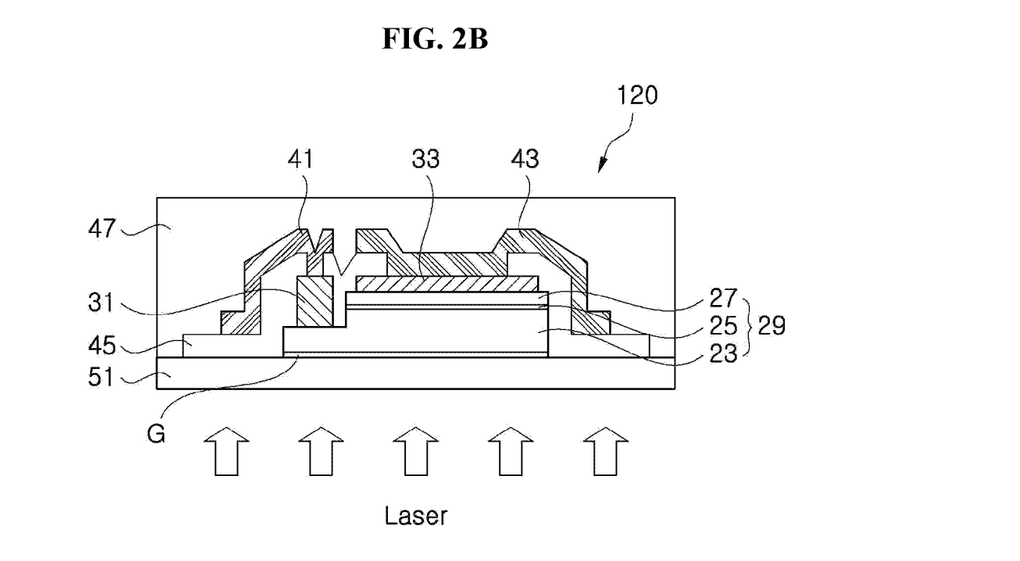

As shown in FIG. 2B, irradiation is performed under the first manufacturing substrate 51 with the laser. As a result, a gap G is formed between the n-type semiconductor layer 23 of the light emitting diode chip 120 and the first manufacturing substrate 51. In this case, the first manufacturing substrate 51 and the light emitting diode chip 120 may be easily separated by the gap G formed between the light emitting diode chip 120 and the first manufacturing substrate 51 while transferring the light emitting diode chip 120 to the second substrate in the subsequent process.

Since the gap G is formed between the light emitting diode chip 120 and the first manufacturing substrate 51 by irradiation, the light emitting diode chip 120 and the first manufacturing substrate 51 are separated from each other. However, it is preferable that the light emitting diode chip 120 is not completely separated from the first manufacturing substrate 51. That is because a process that a location of the first manufacturing substrate 51 is moved to another location before the light emitting diode chip 120 is transferred from the first manufacturing substrate 51 to the second manufacturing substrate 53 may be added, or a process such as inverting the first manufacturing substrate 51 may be added.

Therefore, it is possible to prevent the light emitting diode chip 120 and the first manufacturing substrate 51 from being completely separated each other before a process of lifting the light emitting diode chip 120 by using a moving device or the like, or combining the light emitting diode chip 120 with another substrate such as the second manufacturing substrate 53. Since the first coupler 41 and the second coupler 43 are maintained on the first manufacturing substrate 51 while wrapping the light emitting diode chip 120, they serve to prevent the light emitting diode chip 120 from being separated from the first manufacturing substrate 51.

Figure 2C:
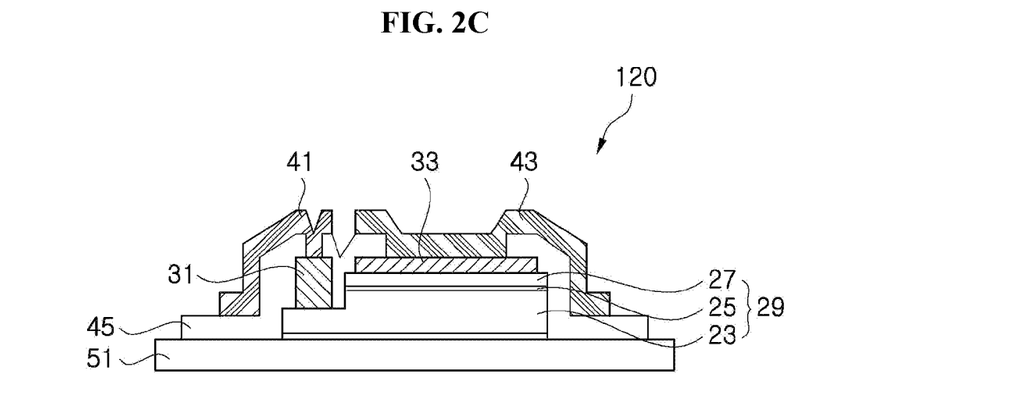

Referring back to FIG. 2B, the irradiation process is completed, and then the protector 47 formed to cover the light emitting diode chip 120 is removed as shown in FIG. 2C. At this time, the n-type semiconductor layer 23 of the light emitting diode chip 120 is in a state of being separated from the first manufacturing substrate 51, and a state in which the light emitting diode chip 120 is coupled to the first manufacturing substrate 51 is maintained by the first coupler 41 and the second coupler 43.

Figure 2D:
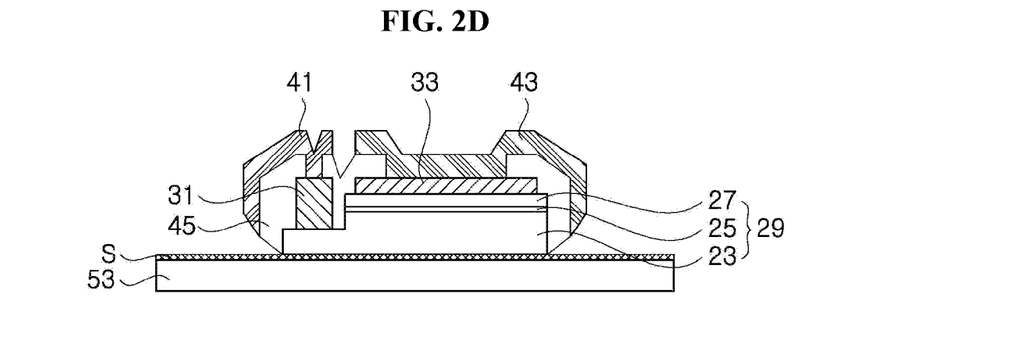

From the state shown in FIG. 2C, as shown in FIG. 2D, the light emitting diode chip 120 is lifted from the first manufacturing substrate 51 and transferred to the second manufacturing substrate 53 by using the moving device or the like so that the light emitting diode chip 120 and the second manufacturing substrate 53 are coupled to each other. At this time, some portions of the insulator 45, the first coupler 41 and the second coupler 43 disposed on side surfaces of the light emitting diode chip 120 may be removed in the process of separating the light emitting diode chip 120 from the first manufacturing substrate 51 using the moving device. Herein, shapes formed after the insulator 45, the first coupler 41 and the second coupler 43 are removed may be formed to have various shapes in the process.

In addition, the second manufacturing substrate 53 and the light emitting diode chip 120 may be coupled by a bonding portion S which may be applied to an upper surface of the second manufacturing substrate 53.

Figure 2E:
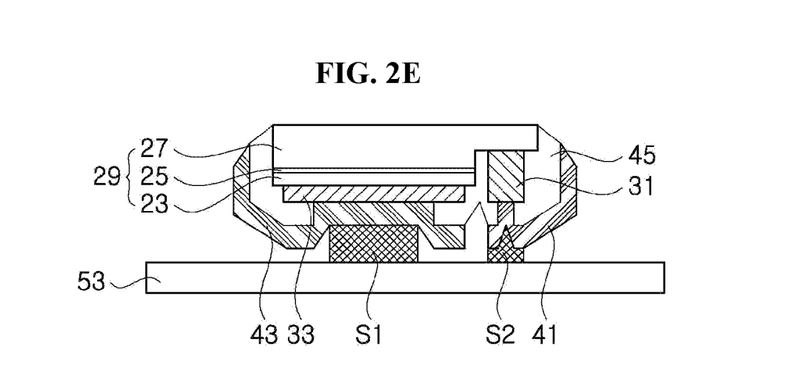

Moreover, as shown in FIG. 2E, in a state that the light emitting diode chip 120 separated from the first manufacturing substrate 51 is inverted, the light emitting diode chip 120 may be transferred to the second manufacturing substrate 53. In this case, elevations of a first bonding portion S1 and a second bonding portion S2 may be adjusted to adjust a horizontal level of the light emitting diode chip 120. That is, as shown in the drawing, since the elevation to the second coupler 43 and the elevation to the first coupler 41 from the second manufacturing substrate 53 may be different, the elevations of the first bonding portion S1 and the second bonding portion S2 may be adjusted, and thus the first bonding portion S1 and the second bonding portion S2 may be coupled to the second manufacturing substrate 53 while having the same elevation in the horizontal direction of the light emitting diode chip 120.

Herein, the second manufacturing substrate 53, such as the first manufacturing substrate 51, may be a substrate having an insulating material for use in the manufacturing process, and may be the printed circuit board on which a first substrate electrode and a second substrate electrode are disposed for supplying power to the light emitting diode chip 120 as necessary.

FIGS. 3A through 3G are plan views illustrating modified shapes of couplers disposed on the light emitting diode chip of the display apparatus according to the first embodiment of the present invention.

Referring to the drawings illustrated in FIGS. 3A through 3G, embodiments according to shapes of the first coupler 41 and the second coupler 43 will be described.

Figure 3A:
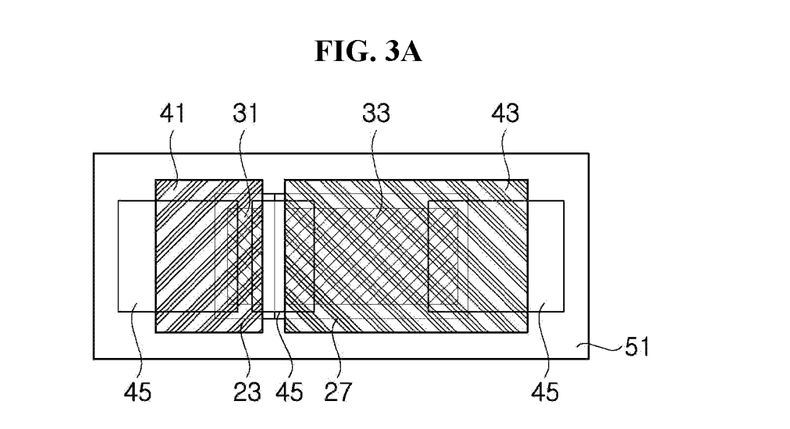
FIGS. 3A, 3B, 3C, 3D, 3E, 3F, and 3G are plan views illustrating modified shapes of couplers disposed on the light emitting diode chip of the display apparatus according to the first embodiment of the present invention.

Referring to FIG. 3A, the first coupler 41 and the second coupler 43 may be disposed to entirely cover the light emitting diode chip 120. In this case, while maintaining the state of being spaced apart from each other, the first coupler 41 and the second coupler 43 may extend in the lateral direction of the light emitting diode chip 120, respectively, thereby being disposed to cover a portion of the upper surface of the first manufacturing substrate 51.

Figure 3B:
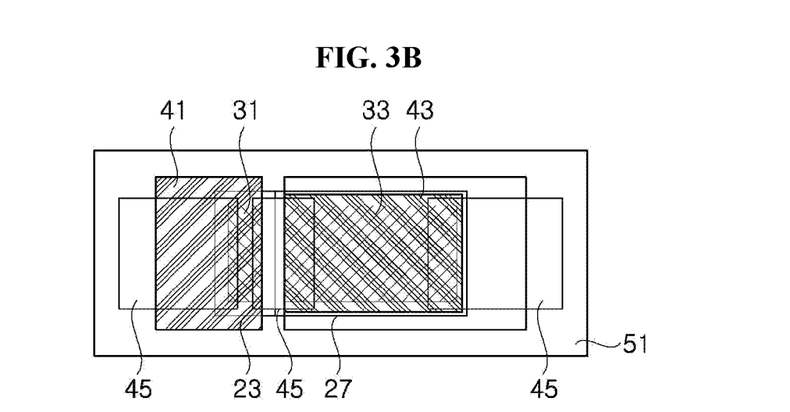

In another embodiment, referring to FIG. 3B, the first coupler 41 extends to side surfaces of the light emitting diode chip 120 and is formed to cover the portion of the upper surface of the first manufacturing substrate 51. Further, the second coupler 43 may be disposed only over the light emitting diode chip 120. That is, the second coupler 43 may be disposed on only the p-type electrode 33. Alternatively, the second coupler 43 may be omitted as necessary.

Accordingly, the first coupler 41 serves to maintain the light emitting diode chip 120 on the first manufacturing substrate 51.

Figure 3C:
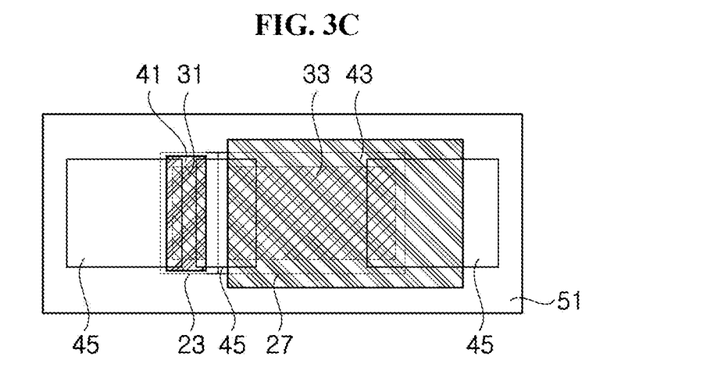

In another embodiment, referring to FIG. 3C, the second coupler 43 extends to the side surfaces of the light emitting diode chip 120 and is formed to cover the portion of the upper surface of the first manufacturing substrate 51. Further, the first coupler 41 may be disposed over only the light emitting diode chip 120. That is, the first coupler 41 is disposed to cover the n-type electrode 31, and is disposed so as not to leave the outside of the exposed n-type semiconductor layer 23. Alternatively, the first coupler 41 may be omitted as necessary.

Accordingly, the second coupler 43 serves to maintain the light emitting diode chip 120 on the first manufacturing substrate 51.

Figure 3D:
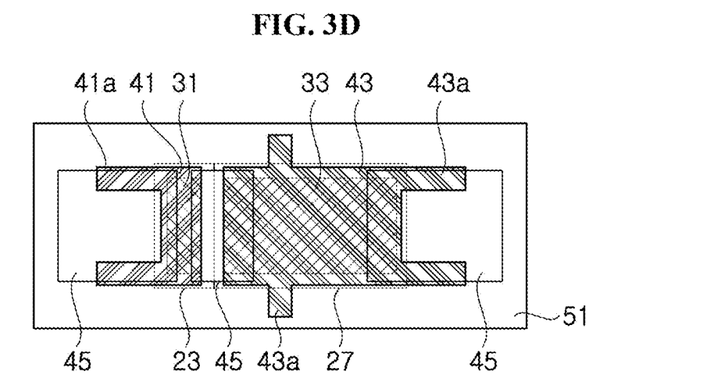

In another embodiment, referring to FIG. 3D, the first coupler 41 and the second coupler 43 are disposed to cover the upper portion of the light emitting diode chip 120, respectively. The first coupler 41 and the second coupler 43 may include a first coupler extension 41a and a second coupler extension 43a, respectively, which are formed by protrusion and extension of the first coupler 41 and the second coupler 43, respectively. At this time, a plurality of first coupler extensions 41a and second coupler extensions 43a may be provided, respectively.

The first coupler extension 41a may extend from the first coupler 41 and may extend to one side direction of the light emitting diode chip 120. In the present embodiment, two first coupler extensions 41a extend in a direction perpendicular to a longitudinal direction of the first coupler 41, but the present invention is not limited thereto. It may extend to the longitudinal direction of the first coupler 41 as necessary. In this case, the first coupler extension 41a may extend in a length from the first coupler 41 to the upper surface of the first manufacturing substrate 51, and the extended length may vary as necessary.

The second coupler extension 43a may extend from the second coupler 43 and may extend to the other side direction of the light emitting diode chip 120. In the present embodiment, two second coupler extensions 43a extend in a direction perpendicular to a longitudinal direction of the second coupler 43, and two second coupler extensions 43a extend in a longitudinal direction of the second coupler 43. However, the number of the second coupler extensions 43a may vary as necessary, and the second coupler extension 43a may extend in a length from the second coupler 43 to the upper surface of the first manufacturing substrate 51, similarly to the first coupler extension 41a.

Figure 3E:
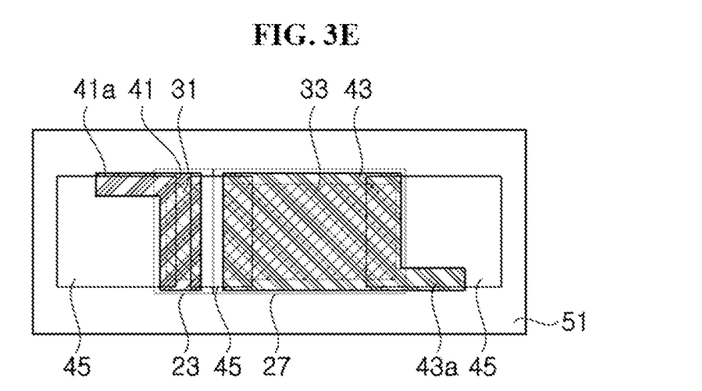

In another embodiment, referring to FIG. 3E, a single first coupler extension 41a may be disposed in the direction perpendicular to the longitudinal direction of the first coupler 41, and a single second coupler extension 43a may be disposed in the longitudinal direction of the second coupler 43. In this case, the first coupler extension 41a is disposed on one side of the first coupler 41, and the second coupler extension 43a is disposed on the other side of the second coupler 43. Accordingly, as shown in the drawing, the first coupler extension 41a and the second coupler extension 43a may be disposed at locations diagonal to each other.

Figure 3F:
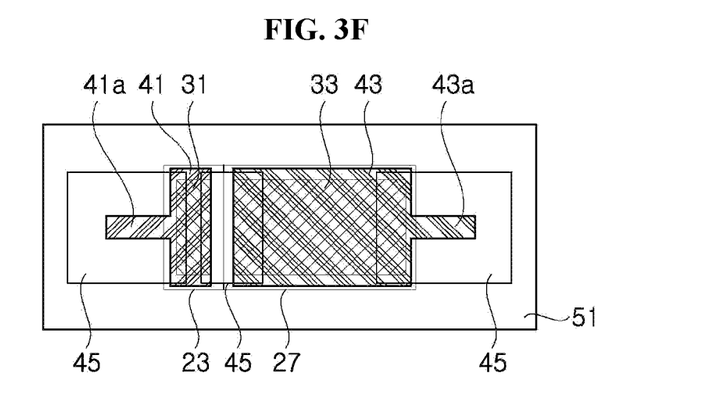

In another embodiment, referring to FIG. 3F, a single first coupler extension 41a may be disposed in the direction perpendicular to the longitudinal direction of the first coupler 41, and a single second coupler extension 43a may be disposed in the longitudinal direction of the second coupler 43. In this case, The first coupler extension 41a may be disposed at a central location on one side of the first coupler 41, and the second coupler extension 43a may be disposed at a central location on the other side of the second coupler 43.

Figure 3G:
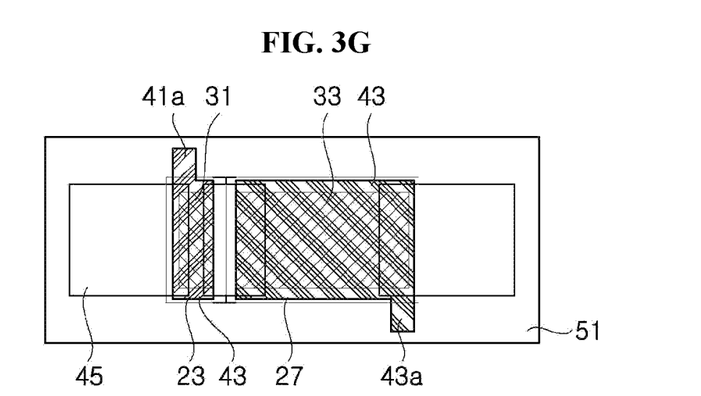

In another embodiment, referring to FIG. 3G, a single first coupler extension 41a may be disposed in the longitudinal direction of the first coupler 41, and a single second coupler extension 43a may be disposed in the direction perpendicular to the longitudinal direction of the second coupler 43. As shown in the drawing, the first coupler extension 41a and the second coupler extension 43a may be disposed at locations diagonal to each other. However, the present invention is not limited thereto, and they may be disposed in the same direction.

Figure 4:
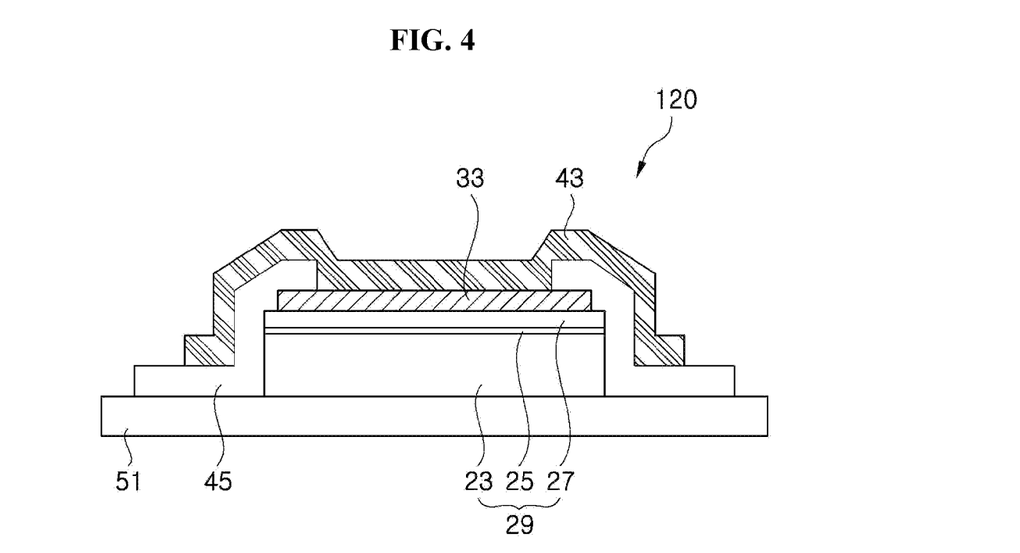
FIG. 4 is a cross-sectional view illustrating a light emitting diode chip of a display apparatus according to a second embodiment of the present invention.

FIG. 4 is a cross-sectional view illustrating a light emitting diode chip of a display apparatus according to a second embodiment of the present invention.

A light emitting diode chip 120 of the display apparatus according to the second embodiment of the present invention includes a light emitting structure 29, a p-type electrode 33, a second coupler 43 and an insulator 45. The light emitting diode chip 120 is disposed on a first manufacturing substrate 51, and may have a structure where an n-type semiconductor layer 23, an active layer 25 and a p-type semiconductor layer 27 may be stacked one another in the stated order. The p-type electrode 33 may be disposed over the p-type semiconductor layer 27, and the second coupler 43 may be disposed on the p-type electrode 33.

That is, as shown in the drawing, the light emitting diode chip 120 may have a vertical structure in the present embodiment. Accordingly, the insulator 45 may be disposed to cover a portion of an upper surface of the p-type electrode 33 and side surfaces of the light emitting structure 29, and the first coupler 41 may be disposed to cover entire upper portions of the exposed p-type electrode 33 and insulator 45. The first coupler 41 may be disposed to extend to an upper surface of the first manufacturing substrate 51.

Figure 5:
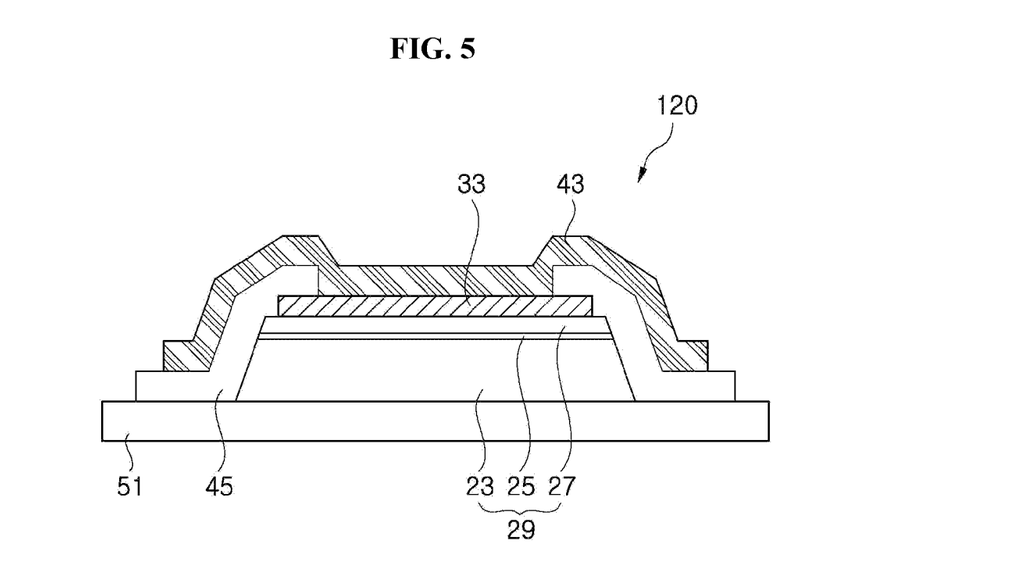
FIG. 5 is a cross-sectional view illustrating a light emitting diode chip of a display apparatus according to a third embodiment of the present invention.

FIG. 5 is a cross-sectional view illustrating a light emitting diode chip of a display apparatus according to a third embodiment of the present invention.

A light emitting diode chip 120 of the display apparatus according to the third embodiment of the present invention includes a light emitting structure 29, a p-type electrode 33, a second coupler 43 and an insulator 45. In the present embodiment, the light emitting diode chip 120 has a vertical structure as in the second embodiment, and side surfaces of the light emitting structure 29 may be inclined. That is, the light emitting diode chip 120 includes the light emitting structure 29 having inclined side surfaces, and thus side surfaces of the insulator 45 and the first coupler 41 may also include inclined surfaces along the side surfaces of the light emitting structure 29.

Although some exemplary embodiments have been described herein, it should be understood by those skilled in the art that these embodiments are given by way of illustration only, and that various modifications, variations, and alterations can be made without departing from the spirit and scope of the present invention. Therefore, the scope of the present invention should be limited only by the accompanying claims and equivalents thereof.

What is claimed is:

1. A display apparatus comprising a light emitting diode chip,
wherein:
the light emitting diode chip comprises:
a light emitting structure including a first conductivity type semiconductor layer, a second conductivity type semiconductor layer, and an active layer interposed between the first and second conductivity type semiconductor layers;
a first electrode electrically connected to the first conductivity type semiconductor layer;
a second electrode electrically connected to the second conductivity type semiconductor layer;
an insulator covering portions of upper surfaces of the first and second electrodes and portions of side surfaces of the light emitting structure; and
couplers disposed on the first and second electrodes and side surfaces of the light emitting structure;
the insulator is disposed between the couplers and the light emitting chip; and
the light emitting structure is separated from a growth substrate so that a bottom surface of the first conductivity type semiconductor layer is exposed.

2. The display apparatus of claim 1, wherein the light emitting diode chip is a horizontal structure;
and the first electrode and the second electrode are arranged in a horizontal direction.

3. The display apparatus of claim 2, wherein:
each of the couplers includes a metal; and
the couplers are configured to reflect light emitted from side surfaces of the light emitting diode chip.

4. The display apparatus of claim 3, wherein:
the couplers comprise a first coupler and a second coupler;
the first coupler and the second coupler are spaced apart from each other and are electrically insulated from each other;
the first coupler is electrically connected to the first electrode; and
the second coupler is electrically connected to the second electrode.

5. A display apparatus comprising a light emitting diode chip,
wherein:
the light emitting diode chip comprises:
a light emitting structure including a first conductivity type semiconductor layer, a second conductivity type semiconductor layer, and an active layer interposed between the first and second conductivity type semiconductor layers;
a first electrode electrically connected to the first conductivity type semiconductor layer;
a second electrode electrically connected to the second conductivity type semiconductor layer;
an insulator covering portions of upper surfaces of the first and second electrodes and portions of side surfaces of the light emitting structure; and
couplers disposed on the first and second electrodes and side surfaces of the light emitting structure;
the insulator is disposed between the couplers and the light emitting chip;
the light emitting diode chip is a horizontal structure;
the first electrode and the second electrode are arranged in a horizontal direction;
each of the couplers includes a metal;
the couplers are configured to reflect light emitted from side surfaces of the light emitting diode chip;
the couplers comprise a first coupler and a second coupler;
the first coupler and the second coupler are spaced apart from each other and are electrically insulated from each other;
the first coupler is electrically connected to the first electrode;
the second coupler is electrically connected to the second electrode; and
an area of the second coupler is greater than that of the first coupler.

6. The display apparatus of claim 4, wherein at least one of the couplers includes an extension portion.

7. The display apparatus of claim 6, wherein the extension portion is disposed at one side of the corresponding coupler in plan view.

8. The display apparatus of claim 7, wherein the extension portion extends in the lateral direction of the light emitting diode chip.

9. The display apparatus of claim 7, wherein the extension portion extends to side surfaces of the light emitting diode chip.

10. The display apparatus of claim 2, wherein one or more of the side surfaces of the light emitting structure are inclined in relation to the horizontal direction.

11. The display apparatus of claim 4, wherein each of the insulator, the first coupler, and the second coupler includes one or more surfaces inclined in relation to the horizontal direction, along with one or more side surfaces of the light emitting structure inclined in relation to the horizontal direction.

12. The display apparatus of claim 2, further comprising a printed circuit board comprising substrate electrodes configured to supply power to the light emitting diode chip.

13. The display apparatus of claim 12, further comprising bonding portions for bonding the light emitting diode chip to the printed circuit board.

14. A display apparatus comprising:
a light emitting diode chip;
a printed circuit board comprising substrate electrodes configured to supply power to the light emitting diode chip; and
bonding portions for bonding the light emitting diode chip to the printed circuit board,
wherein:
the light emitting diode chip comprises:
 a light emitting structure including a first conductivity type semiconductor layer, a second conductivity type semiconductor layer, and an active layer interposed between the first and second conductivity type semiconductor layers;
 a first electrode electrically connected to the first conductivity type semiconductor layer;
 a second electrode electrically connected to the second conductivity type semiconductor layer;
 an insulator covering portions of upper surfaces of the first and second electrodes and portions of side surfaces of the light emitting structure; and
 couplers disposed on the first and second electrodes and side surfaces of the light emitting structure;
the insulator is disposed between the couplers and the light emitting chip;
the light emitting diode chip is a horizontal structure;
the first electrode and the second electrode are arranged in a horizontal direction; and
bottom surfaces of the bonding portions have the same elevation in the horizontal direction of the light emitting diode chip.

* * * * *